(12) United States Patent
Blomiley et al.

(10) Patent No.: US 8,216,935 B2
(45) Date of Patent: Jul. 10, 2012

(54) METHODS OF FORMING TRANSISTOR GATE CONSTRUCTIONS, METHODS OF FORMING NAND TRANSISTOR GATE CONSTRUCTIONS, AND METHODS FORMING DRAM TRANSISTOR GATE CONSTRUCTIONS

(75) Inventors: Eric R. Blomiley, Boise, ID (US); Allen McTeer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 573 days.

(21) Appl. No.: 12/419,807

(22) Filed: Apr. 7, 2009

(65) Prior Publication Data

US 2010/0255669 A1  Oct. 7, 2010

(51) Int. Cl.
*H01L 21/44* (2006.01)

(52) U.S. Cl. ........ 438/656; 438/233; 438/587; 438/592; 438/652; 438/674; 438/685

(58) Field of Classification Search .................. 438/233, 438/587, 592, 652, 656, 674, 685
See application file for complete search history.

(56) References Cited

U.S. PATENT DOCUMENTS

| | | | | |
|---|---|---|---|---|
| 6,184,129 B1 * | 2/2001 | Hwang et al. | ................ | 438/653 |
| 6,335,254 B1 * | 1/2002 | Trivedi | .................... | 438/305 |
| 7,030,012 B2 * | 4/2006 | Divakaruni et al. | ......... | 438/652 |
| 2003/0162396 A1 * | 8/2003 | Kohyama et al. | ............. | 438/689 |
| 2006/0094238 A1 * | 5/2006 | Levy et al. | .................... | 438/656 |
| 2007/0037343 A1 * | 2/2007 | Colombo et al. | ............. | 438/231 |
| 2007/0272960 A1 * | 11/2007 | Hsu et al. | ....................... | 257/295 |
| 2008/0157169 A1 * | 7/2008 | Yuan | .............................. | 257/319 |
| 2009/0026626 A1 * | 1/2009 | Matsuyama et al. | .......... | 257/770 |

OTHER PUBLICATIONS

Rana et al., "Selective Tungsten Plugs on Silicon for Advanced CMOS Devices", 1987 IEEE pp. 862-865.
Wolf et al., "Growth Rate Modeling for Selective Tungsten LPCVD", Applied Surface Science 91 (1995), pp. 332-338.
Yeh et al., "Selective tungsten CVD on submicron contact hole", Thin Solid Films 270 (1995), pp. 462-466.

* cited by examiner

*Primary Examiner* — Bac Au
(74) *Attorney, Agent, or Firm* — Wells St. John, P.S.

(57) ABSTRACT

A method of forming a transistor gate construction includes forming a gate stack comprising a sacrificial material received over conductive gate material. The gate stack has lateral sidewalls having insulative material received thereagainst. The sacrificial material is removed from being received over the conductive gate material to form a void space between the insulative material over the conductive gate material. Elemental tungsten is selectively deposited within the void space over the conductive gate material and a transistor gate construction forming there-from is formed there-from, and which has a conductive gate electrode which includes the conductive gate material and the elemental tungsten. The transistor gate might be used in NAND, DRAM, or other integrated circuitry.

30 Claims, 20 Drawing Sheets

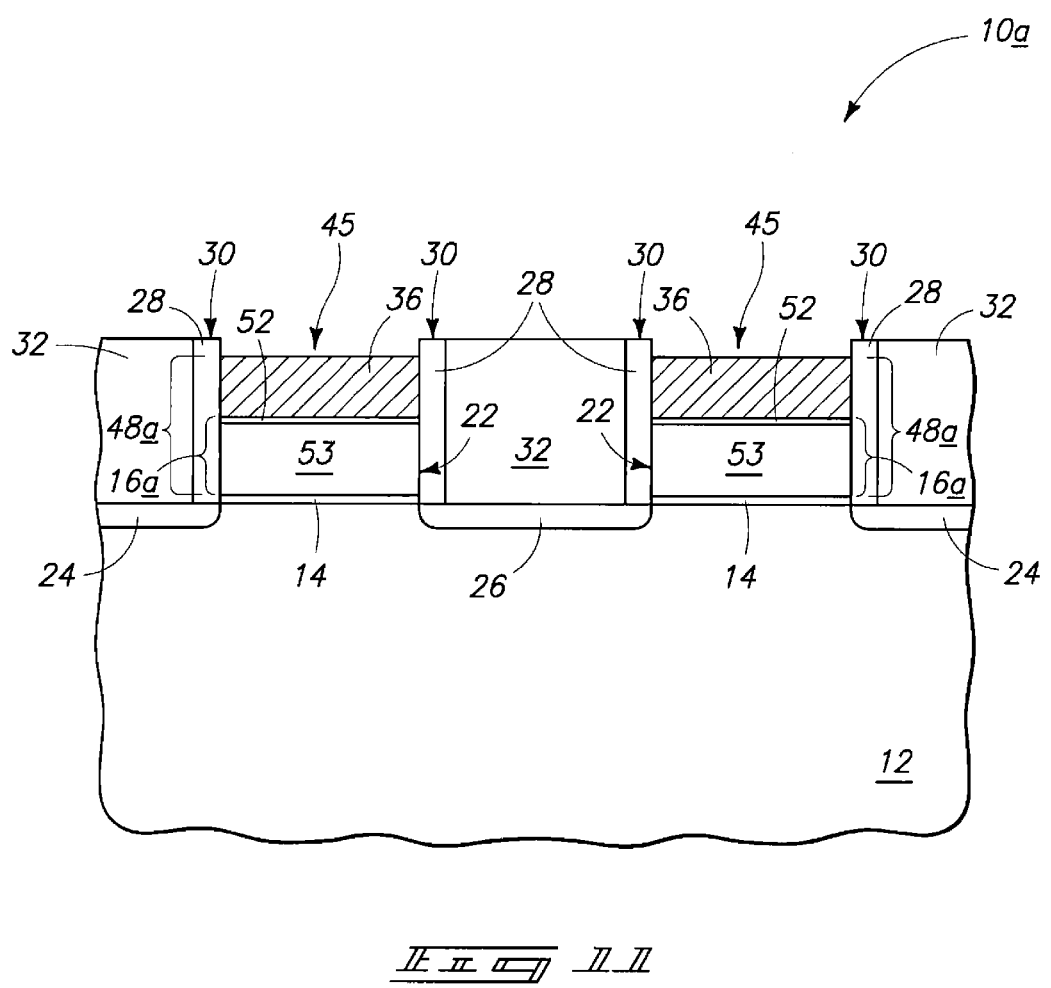

METHODS OF FORMING TRANSISTOR GATE CONSTRUCTIONS, METHODS OF FORMING NAND TRANSISTOR GATE CONSTRUCTIONS, AND METHODS FORMING DRAM TRANSISTOR GATE CONSTRUCTIONS

TECHNICAL FIELD

Embodiments disclosed herein pertain to methods of forming transistor gate constructions, for example as might be used in integrated circuitry such as NAND and DRAM.

BACKGROUND

As individual device dimensions become smaller in integrated circuitry, there is a continuing challenge to maintain sufficient conductance and current flow in spite of the smaller sizes. Conductive elemental metals provide reduced resistance in comparison to conductively doped silicon and metal silicides. However, elemental metals may be more problematic to deposit and/or etch in comparison to other materials. One low resistance material of interest is elemental tungsten. Such may be used as a conductive gate material in transistor gate constructions. However, elemental tungsten is difficult to etch when subtractively patterning a transistor gate, and may lead to tungsten contamination elsewhere on the substrate over which the tungsten is received.

Transistor gates are used in many different types of integrated circuitry, for example in logic circuitry and memory circuitry. Memory circuitry provides data storage for electronic systems, and may be volatile or non-volatile. Non-volatile memory may be characterized by data or programmed retention after the device is turned "off". Volatile memory, on the other hand, is required to be repeatedly rewritten due to charge dissipation and is lost when the circuitry is turned "off". Dynamic Random Access Memory (DRAM) is one type of volatile memory. Static random access memory and flash are two examples of non-volatile memory.

A flash memory is a type of EEPROM (electrically-erasable programmable read-only memory) that may be erased and reprogrammed in blocks. Many modern personal computers have BIOS stored on a flash memory chip. Such BIOS is sometimes called flash BIOS. Flash memory is also popular in wireless electronic devices as it enables manufacturers to support new communication protocols as they become standardized, and provides the ability to remotely upgrade the devices for enhanced features.

A typical flash memory comprises a memory array that includes a large number of memory cells arranged in row and column fashion. The cells are usually grouped into blocks. Each of the cells within a block may be electrically programmed by charging a floating gate. The charge may be removed from the floating gate by a block erase operation. Data is stored in a cell as charge in the floating gate.

NAND is a basic architecture of flash memory. A NAND cell unit comprises at least one select gate coupled in series to a serial combination of memory cells (with the serial combination being commonly referred to as a NAND string).

Flash memory incorporates charge storage structures into transistor gates, and incorporates control gate structures over the charge storage structures. The charge storage structures may be immediately over gate dielectric. The charge storage structures comprise material capable of storing/trapping charge and which is collectively referred to herein as floating gate material. The amount of charge stored in the charge storage structures determines a programming state. In contrast, standard field effect transistors (FETs) do not utilize charge storage structures as part of the transistors, but instead have a conductive gate directly over gate dielectric material.

BRIEF DESCRIPTION OF THE DRAWINGS

FIG. 18 is a simplified block diagram of a memory system in accordance with an embodiment.

DETAILED DESCRIPTION OF EXAMPLE EMBODIMENTS

Figure 1:
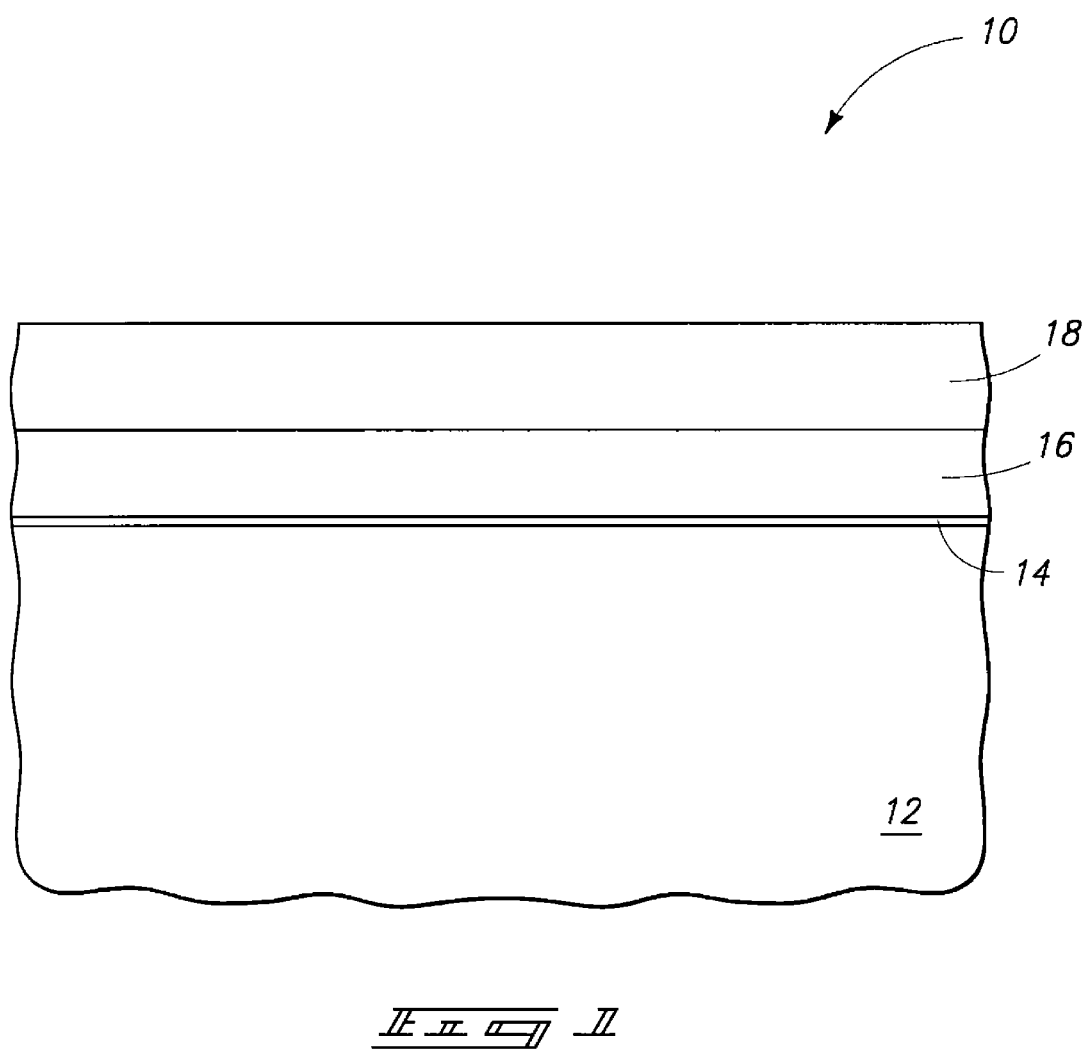
FIG. 1 is a diagrammatic sectional view of a substrate in process in accordance with an embodiment of the invention.

Some embodiments of methods of forming a transistor gate construction are described initially with reference to FIGS. 1-10 with respect to a substrate fragment 10. Referring to FIG. 1, substrate fragment 10 comprises a substrate 12, for example a semiconductor substrate comprised of lightly background doped monocrystalline silicon. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A gate dielectric material 14 has been deposited over semiconductor substrate 12. Any existing or yet-to-be developed material is contemplated, with silicon dioxide being an example. Gate dielectric 14 may be homogenous or non-homogenous, for example comprising multiple different dielectric compositions and layers.

A conductive gate material 16 has been deposited over gate dielectric material 14. Such also may be homogenous or non-homogenous, and may include multiple different conductive compositions and layers. Examples include conductively doped semiconductive material (i.e., silicon), elemental metals, alloys of elemental metals, and conductive metal compounds. Any suitable thicknesses may be chosen for materials 14 and 16.

A sacrificial material 18 has been deposited over conductive gate material 16, and in the depicted embodiment has been deposited onto conductive gate material 16. In the context of this document, "on" or "onto" requires deposition into some direct physical touching contact with the stated material. In contrast, use of the word "over" does not require direct physical touching contact, and accordingly may or may not encompass some intervening material. Regardless, sacrificial material 18 may or may not be homogenous, and for example may comprise multiple different compositions and layers. Sacrificial material 18 may comprise any one or combination of insulator material, semiconductive material, and conductive material. An innermost portion of sacrificial material 18 is of different composition from that of an outermost portion of conductive gate material 16 where such are entirely in direct physical touching contact. Examples for material 18 included amorphous silicon and polysilicon (whether doped or undoped), and silicon dioxide and silicon nitride. An example thickness range for material 18 is from about 30 Angstroms to about 500 Angstroms.

Figure 2:
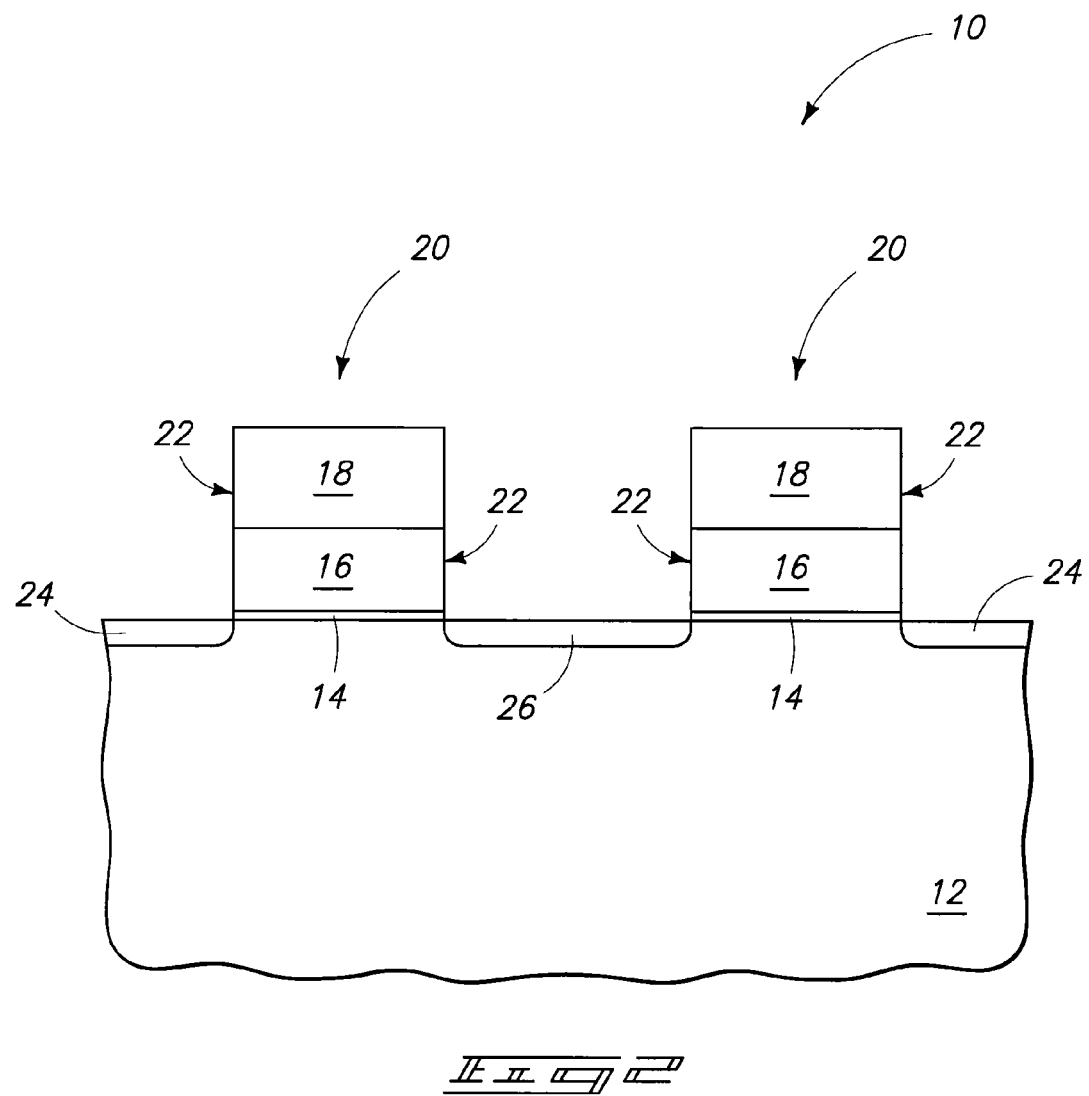
FIG. 2 is a view of the FIG. 1 substrate at a processing step subsequent to that shown by FIG. 1.

Referring to FIG. 2, sacrificial material 18 and conductive gate material 16 have been subtractively patterned to form a patterned gate stack 20, with two such gate stacks being shown. FIG. 2 also shows subtractive patterning and etch of gate dielectric material 14. The patterning and etch may be conducted, for example, using photolithographic patterning followed by subsequent anisotropic etching of materials 18, 16 and 14. Such provides but one example of forming a gate stack 20 which comprises a sacrificial material received over conductive gate material. Alternate existing or yet-to-be-developed techniques might be used, for example damascene processing. Regardless, gate stacks 20 may be considered as comprising opposing lateral sidewalls 22. Suitable implant doping is also shown as having been conducted to form diffusion regions 24 and 26 for formation of source/drain regions.

Figure 3:
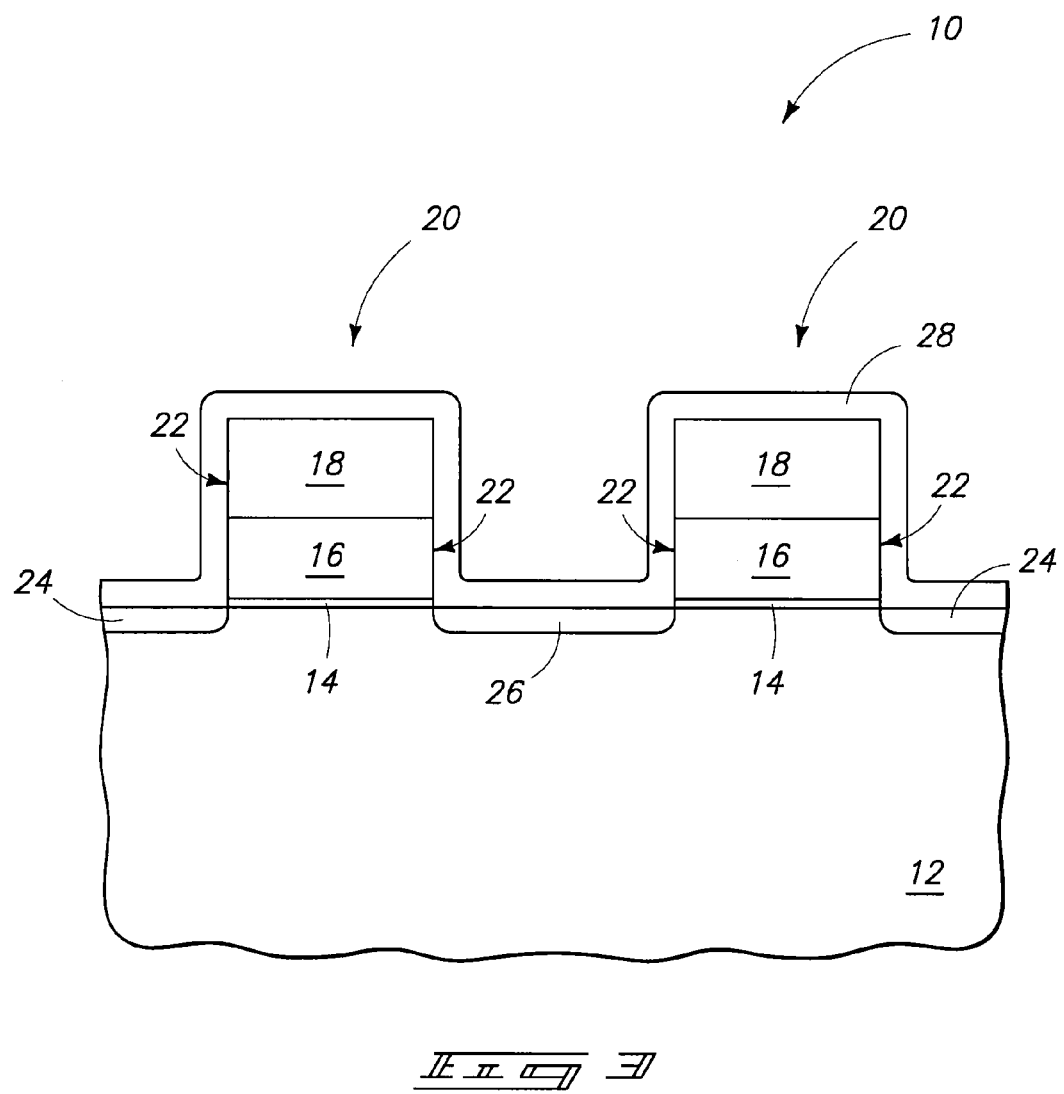
FIG. 3 is a view of the FIG. 2 substrate at a processing step subsequent to that shown by FIG. 2.

Referring to FIG. 3, a layer of insulative material 28 has been deposited over gate stacks 20. Example materials include one or both of silicon dioxide and silicon nitride. Ideally, composition of insulator material 28 is different from composition of sacrificial material 18.

Figure 4:
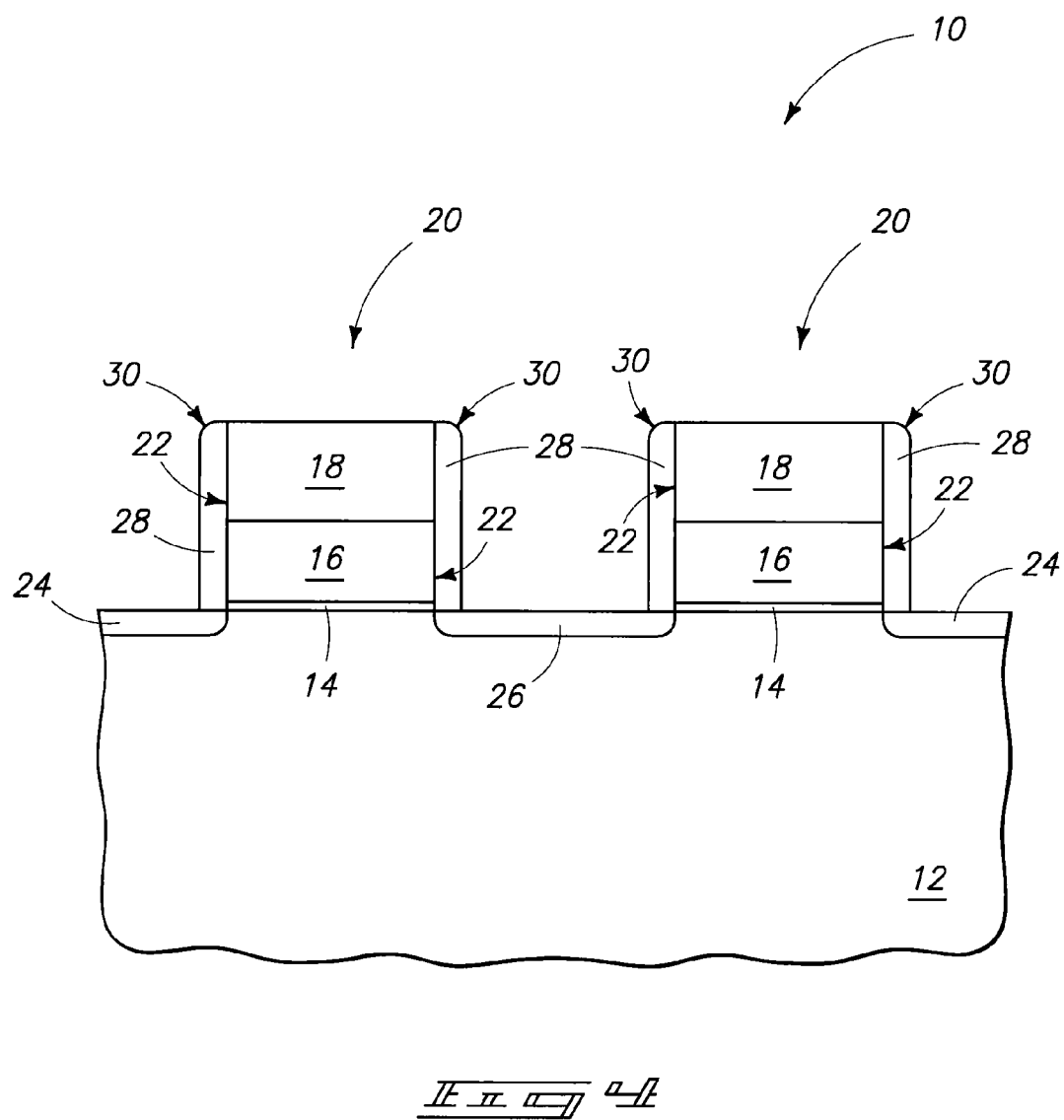
FIG. 4 is a view of the FIG. 3 substrate at a processing step subsequent to that shown by FIG. 3.

Referring to FIG. 4, insulative material layer 28 has been anisotropically etched to form insulative sidewall spacers 30 of insulative material 28. Such provides but one example method of providing insulative material which is received against lateral sidewalls 22 of gate stacks 20. Alternate or additional techniques are of course contemplated, for example oxidation of sidewalls 22 and/or deposition of insulative material to completely fill between adjacent gate stacks 20. Substrate material 12 of FIG. 4 may be doped either in addition to or in lieu of the example doping shown in FIG. 2 for forming source/drain regions.

Figure 5:
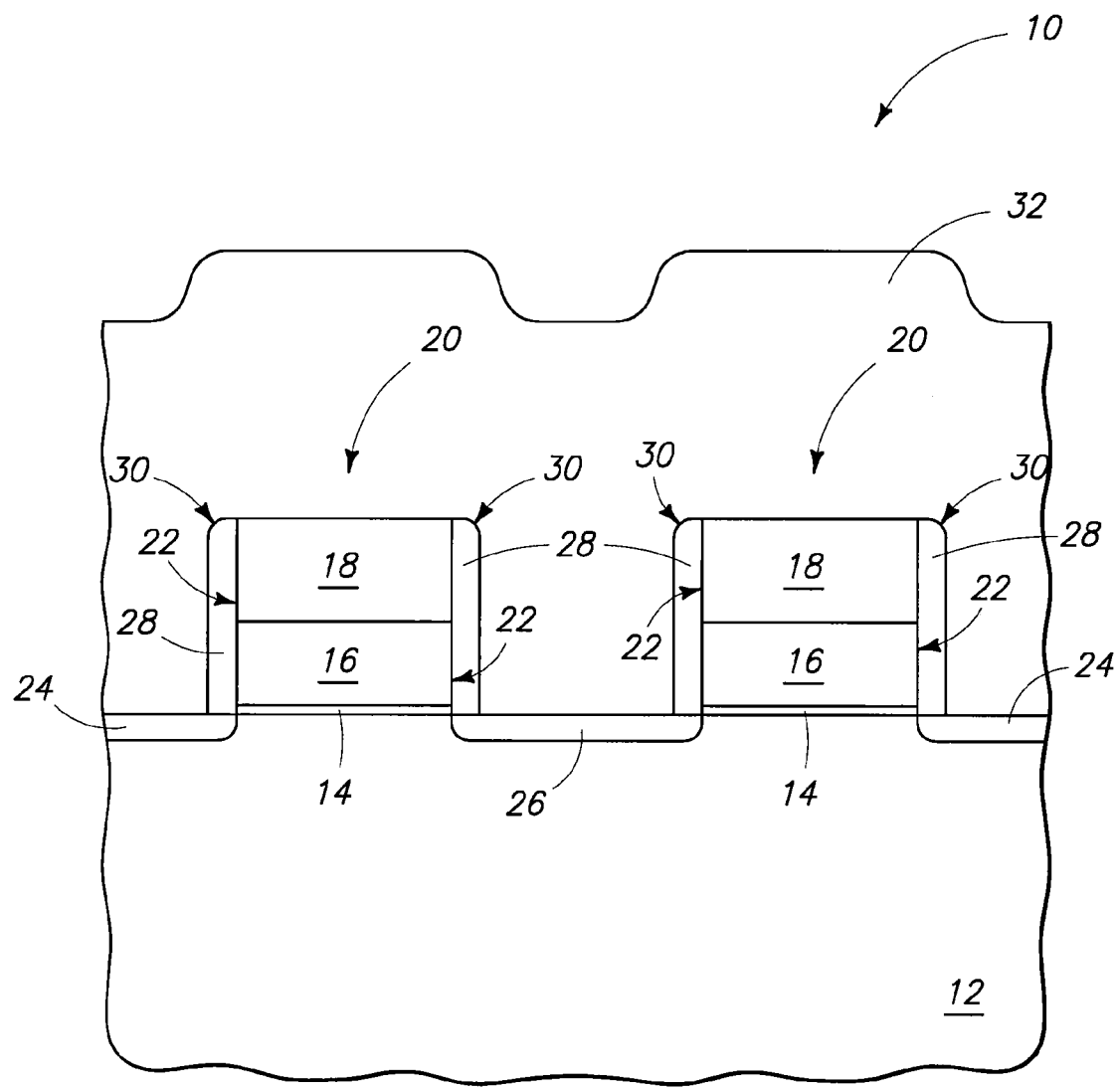
FIG. 5 is a view of the FIG. 4 substrate at a processing step subsequent to that shown by FIG. 4.

Referring to FIG. 5, insulative material 32 has been formed over substrate 12. Such may be homogenous or non-homogenous, with example materials being doped or undoped silicon dioxide (i.e., borophosphosilicate glass) and silicon nitride. Such may be the same or different in composition as that of material 28.

Figure 6:
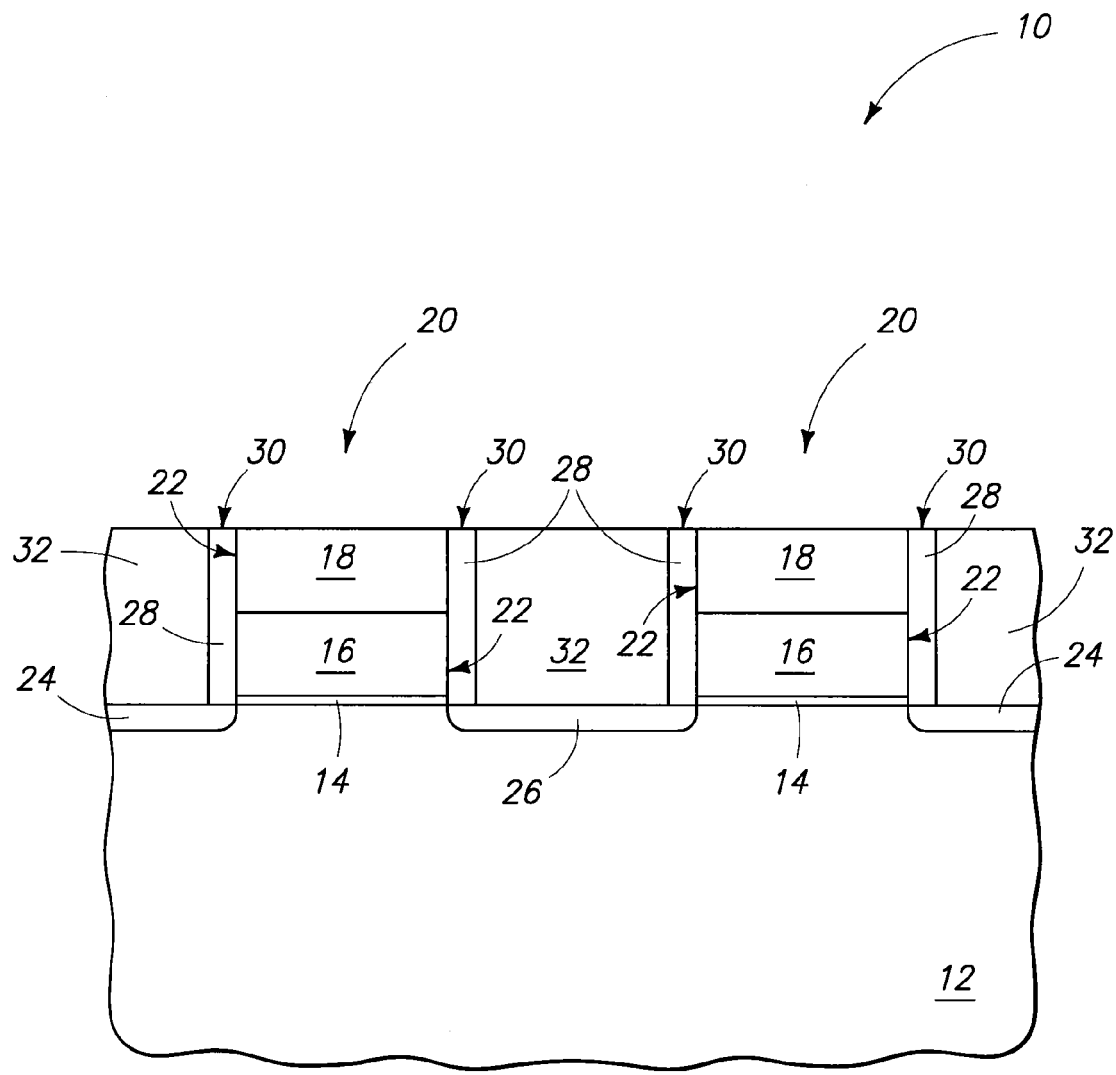
FIG. 6 is a view of the FIG. 5 substrate at a processing step subsequent to that shown by FIG. 5.

Referring to FIG. 6, insulative material 32 has been planarized back at least to an outermost surface of sacrificial material 18. Example techniques include resist etch back, mechanical polishing, and chemical mechanical polishing. In one embodiment, sacrificial material 18 is of different composition from that of insulative material 32. Further, one or more outer materials may be provided over/as part of sacrificial material 18 prior to the patterning of FIG. 2 and which may be removed in the example planarization of FIG. 6.

Figure 7:
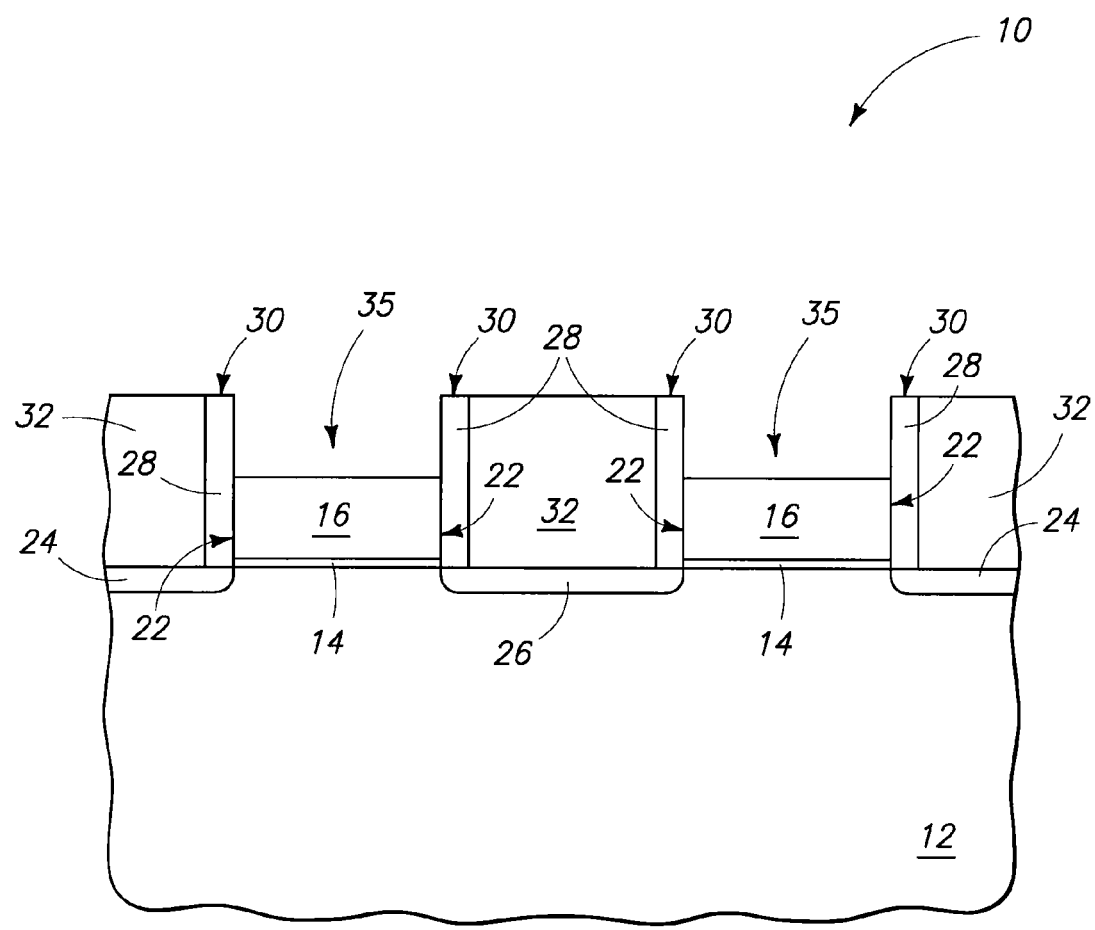
FIG. 7 is a view of the FIG. 6 substrate at a processing step subsequent to that shown by FIG. 6.

Referring to FIG. 7, sacrificial material 18 (not shown) has been removed from being received over conductive gate material 16 to form a void space 35 between insulative material 28/30 over conductive gate material 16. An example preferred technique for the removing is etching of the composition(s) of material 18 selectively relative to materials 30 and 32. In the context of this document, a selective etch or a selective deposit requires etching or depositing, respectively, of the stated material at a rate of at least 2:1 relative to other material exposed on the substrate at some point during the respective stated act of depositing or etching.

Figure 8:
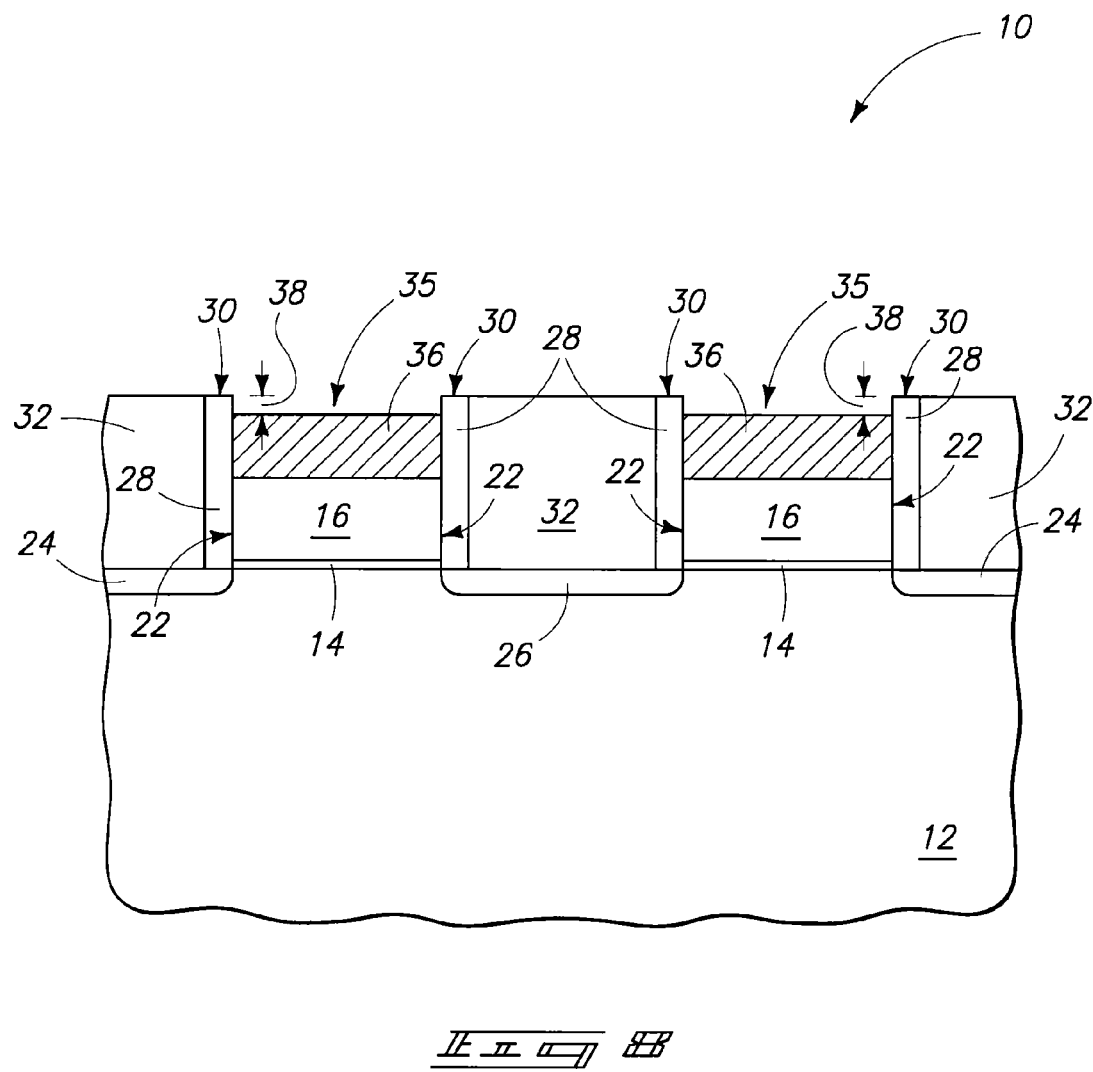
FIG. 8 is a view of the FIG. 7 substrate at a processing step subsequent to that shown by FIG. 7.

Referring to FIG. 8, elemental tungsten 36 has been selectively deposited within void space 35 over conductive gate material 16. Such may or may not fill or over-fill void space 35, and regardless may or may not span completely between insulative material 28/30. FIG. 8 depicts an embodiment wherein the selectively depositing of elemental tungsten 36 within void space 35 over conductive gate material 16 does not fill such void space, and leaves an outermost void space portion 38 between insulative material 30 outwardly open. In one embodiment, elemental tungsten 36 of the transistor gate construction being fabricated is never etched or otherwise removed after its deposition to preclude risk of contamination to other portions of the substrate.

As an example, elemental tungsten 36 may be selectively deposited relative to conductive gate material 16 as depicted using $SiH_4$ reduction of $WF_6$ in chemical vapor deposition processing. An example substrate temperature during deposition is from 250° C. to 400° C., with an example chamber pressure being from 1 mTorr to 1 Torr. Noble gases and/or $N_2$ might be used as carrier gas. Deposition rate of elemental tungsten 36, in one example, may be anywhere from 1 Angstrom per second to 500 Angstroms per second in achieving a selective deposition to conductively doped polysilicon, metal, and/or metal compound gate material 16 relative to silicon dioxide or silicon nitride. Example selective tungsten deposition techniques are described in "Selective tungsten CVD on submicron contact hole", Yeh et al., Thin Solid Films 270 (1995), pp. 462-466; "Growth rate modeling for selective tungsten LPCVD", Wolf et al., Applied Surface Science 91 (1995), pp. 332-338; and "Selective Tungsten Plugs On Silicon For Advanced CMOS Devices", Rana et al., 1987 IEEE, pp. 862-865.

Figure 9:
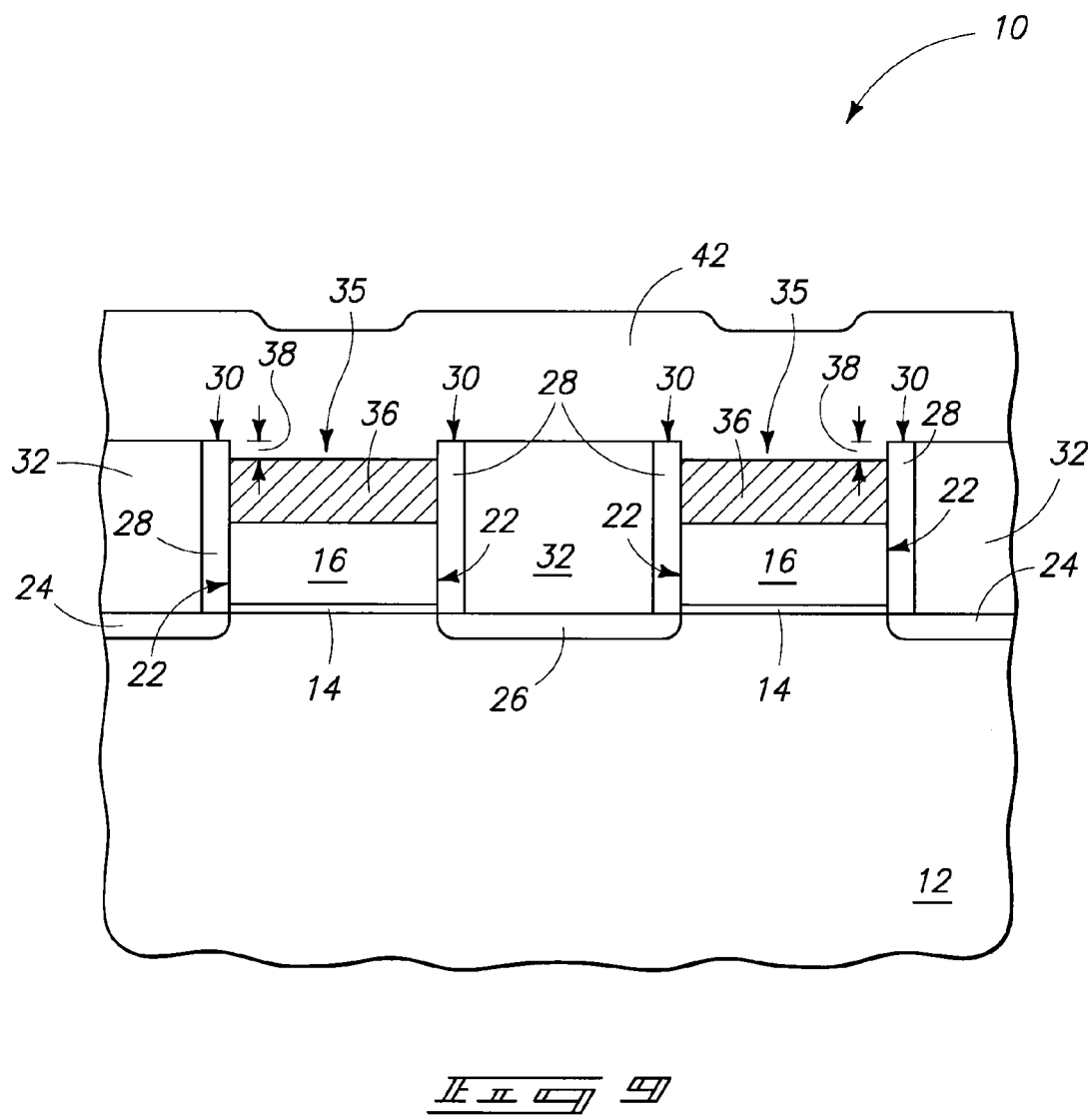
FIG. 9 is a view of the FIG. 8 substrate at a processing step subsequent to that shown by FIG. 8.

Referring to FIG. 9, an insulator 42 has been deposited to fill outwardly open portion 38 of void space 35. Example materials include any of those described above for spacers 30 and insulative material 32. Accordingly, such may or may not be the same as either or both of materials 28/30 and 32.

Figure 10:
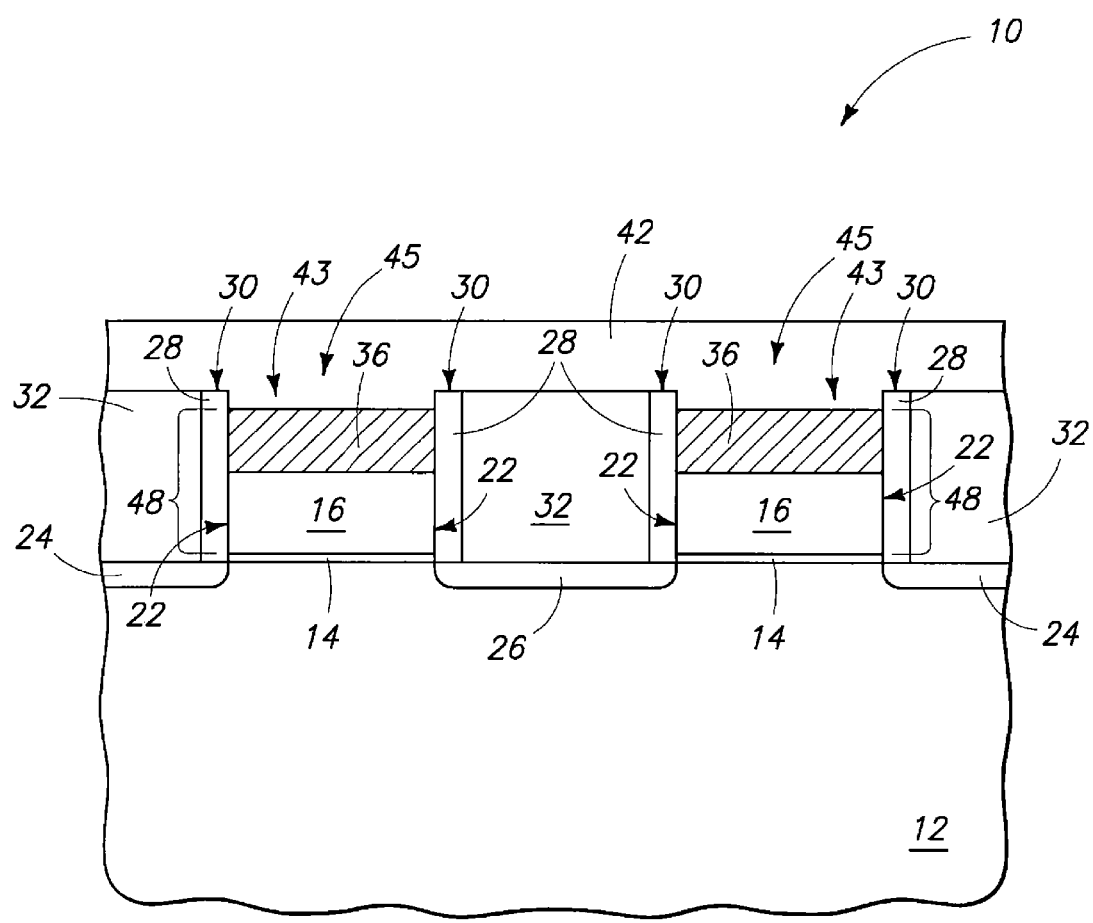
FIG. 10 is a view of the FIG. 9 substrate at a processing step subsequent to that shown by FIG. 9.

FIG. 9 depicts an example wherein deposition of insulator 42 has been sufficient to overfill outwardly open portion 38 of void space 35. Referring to FIG. 10, insulator 42 has been planarized back. An insulator cap 43 of material 42 is received over elemental tungsten 36 between insulative material 30/28. FIG. 10 thereby, in but one example, depicts a pair of transistor gate constructions 45 respectively comprising a conductive gate electrode 48 comprising conductive gate material 16 and elemental tungsten 36. FIG. 10 also depicts an example embodiment wherein a transistor gate construction 45 also includes a combination of gate dielectric 14, insulator cap 43, and anisotropically etched insulative sidewall spacers 30.

Figure 11B:
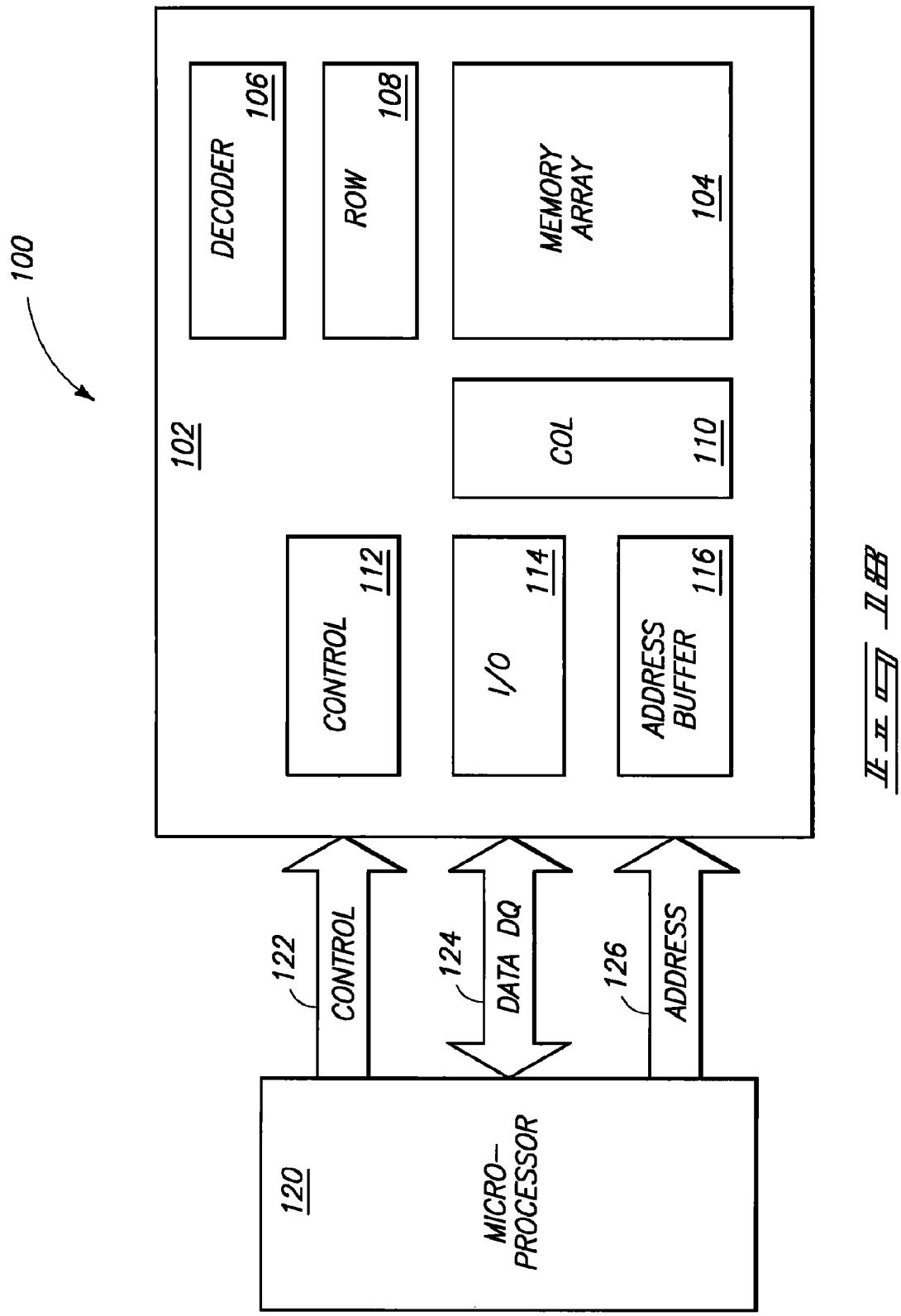
FIG. 11 is a diagrammatic sectional view of a substrate in process in accordance with an embodiment of the invention.

Another example embodiment of a method of forming a transistor gate construction is described in FIG. 11 with respect to a substrate fragment 10a. Like numerals from the above-described embodiments have been utilized where appropriate, with some construction differences being indicated with the suffix "a" or with different numerals. FIG. 11 corresponds in processing sequence to that of FIG. 8, but with respect to a modified substrate 10a. In FIG. 11, conductive gate material 16a is depicted as comprising an outermost portion 52 and an innermost portion 53 collectively comprised of at least two different materials. For example and by way of example only, innermost portion 53 may comprise conductively doped silicon, and outermost portion 52 may comprise a conductive diffusion barrier layer to diffusion of overlying elemental tungsten 36 and polysilicon material 53 relative to one another. Tungsten silicide and tungsten nitride are example barrier materials. Other conductive metal silicides and conductive metal nitrides, and other conductive metal compounds, may be used which do not necessarily include tungsten. An example thickness range for outer portion 52 is from 50 Angstroms to 150 Angstroms. Portion 52 may, for example, be provided as part of the layers of FIG. 1 prior to patterning to form the gate stacks of FIG. 2.

In FIG. 11, elemental tungsten 36 has been selectively deposited onto outermost portion 52. Processing may otherwise or alternately proceed as described above in connection with the FIGS. 1-10 embodiments. Regardless, in one embodiment, conductive gate material 16 may entirely comprise a conductive metal compound wherein an outermost portion of conductive gate material 16 inherently comprises such, with elemental tungsten being selectively deposited there-on.

Where an outermost portion of conductive gate material 16/53 comprises conductively doped silicon, a conductive barrier material there-above as described may reduce diffusion, electromigration, and stress migration. Further, such may provide less elemental tungsten intermixing with silicon. Also, bottom-up selective deposition of tungsten within the void space may result in larger grain size. For example, grain size in such instance may be limited to trench width, whereas in standard CVD, fill grains may be limited to one-half trench width. Larger tungsten grains may mean less electrical resistance.

Figure 12:
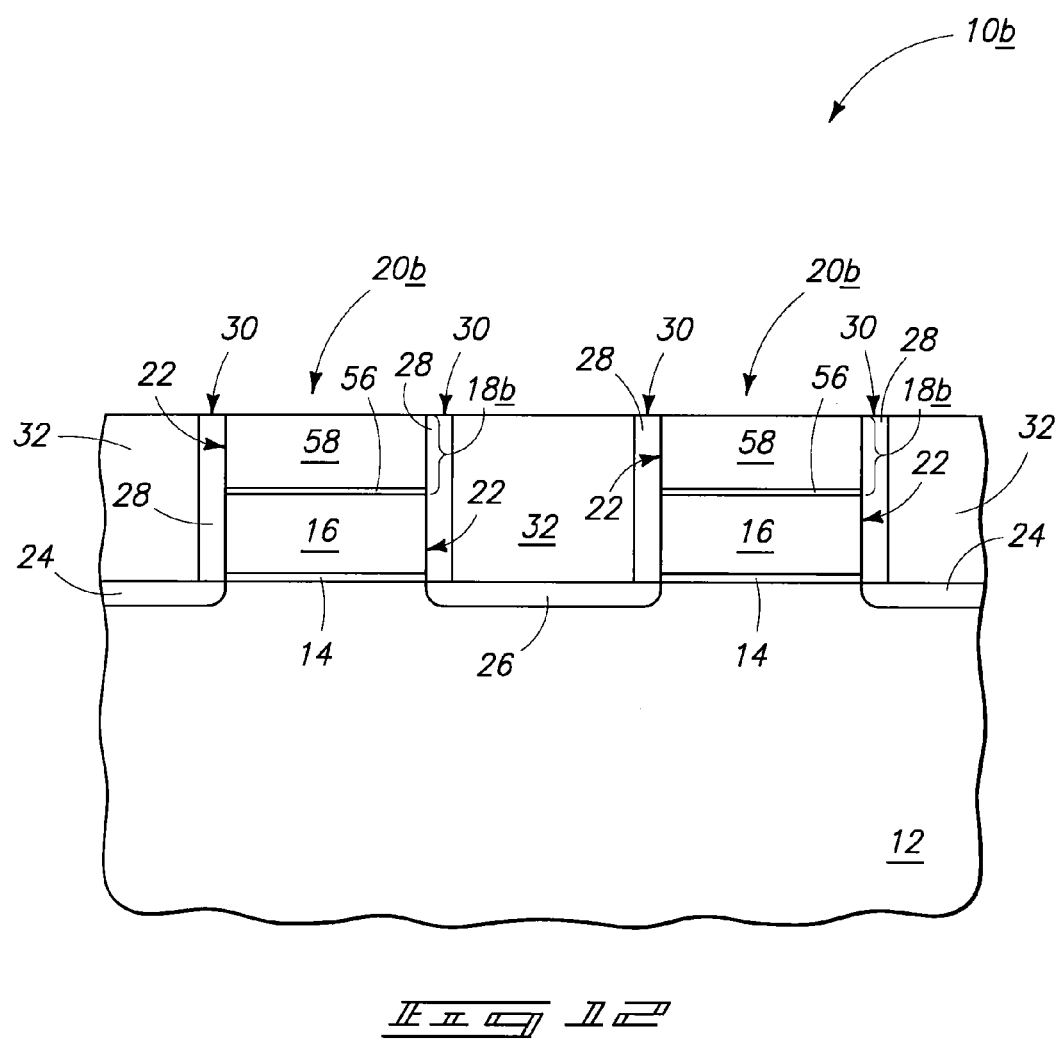
FIG. 12 is a diagrammatic sectional view of a substrate in process in accordance with an embodiment of the invention.

Another embodiment of a method of forming a transistor gate construction is next described with reference to FIGS. 12-14 with respect to a substrate fragment 10b. Like numerals from the above-described embodiments have been utilized where appropriate, with some construction differences being indicated with the suffix "b" or with different numerals. FIG. 12 depicts an alternate substrate 10b. Specifically, FIG. 12 depicts sacrificial material 18b as comprising a first material 56 and a second material 58 received thereover, and with second material 58 being of different composition from first material 56. In one example, first material 56 comprises silicon dioxide or silicon nitride, and second material 58 comprises silicon, whether doped or undoped and if doped whether doped to be conductive, semiconductive or not conductive. Accordingly in one example, sacrificial material 18b comprises an insulator material and a semiconductor material.

Figure 13:
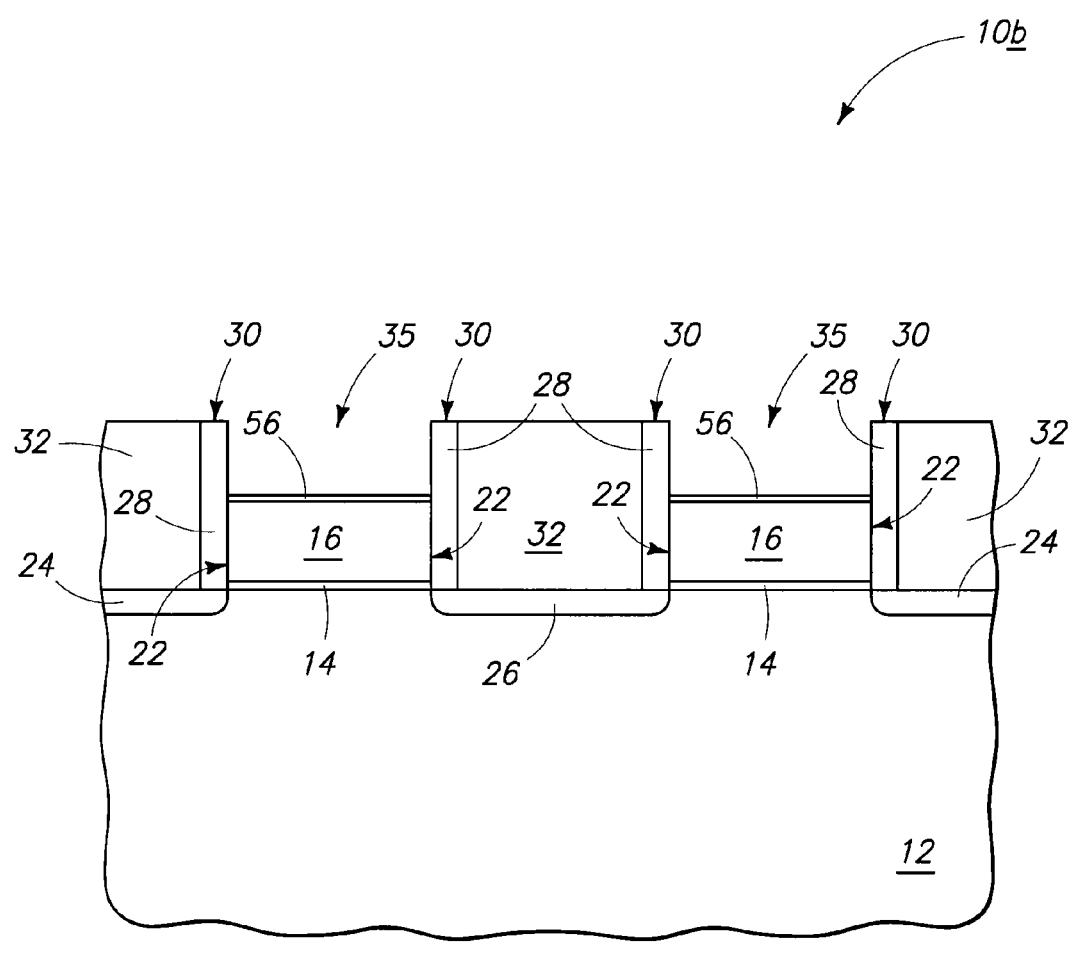
FIG. 13 is a view of the FIG. 12 substrate at a processing step subsequent to that shown by FIG. 12.
Figure 14:
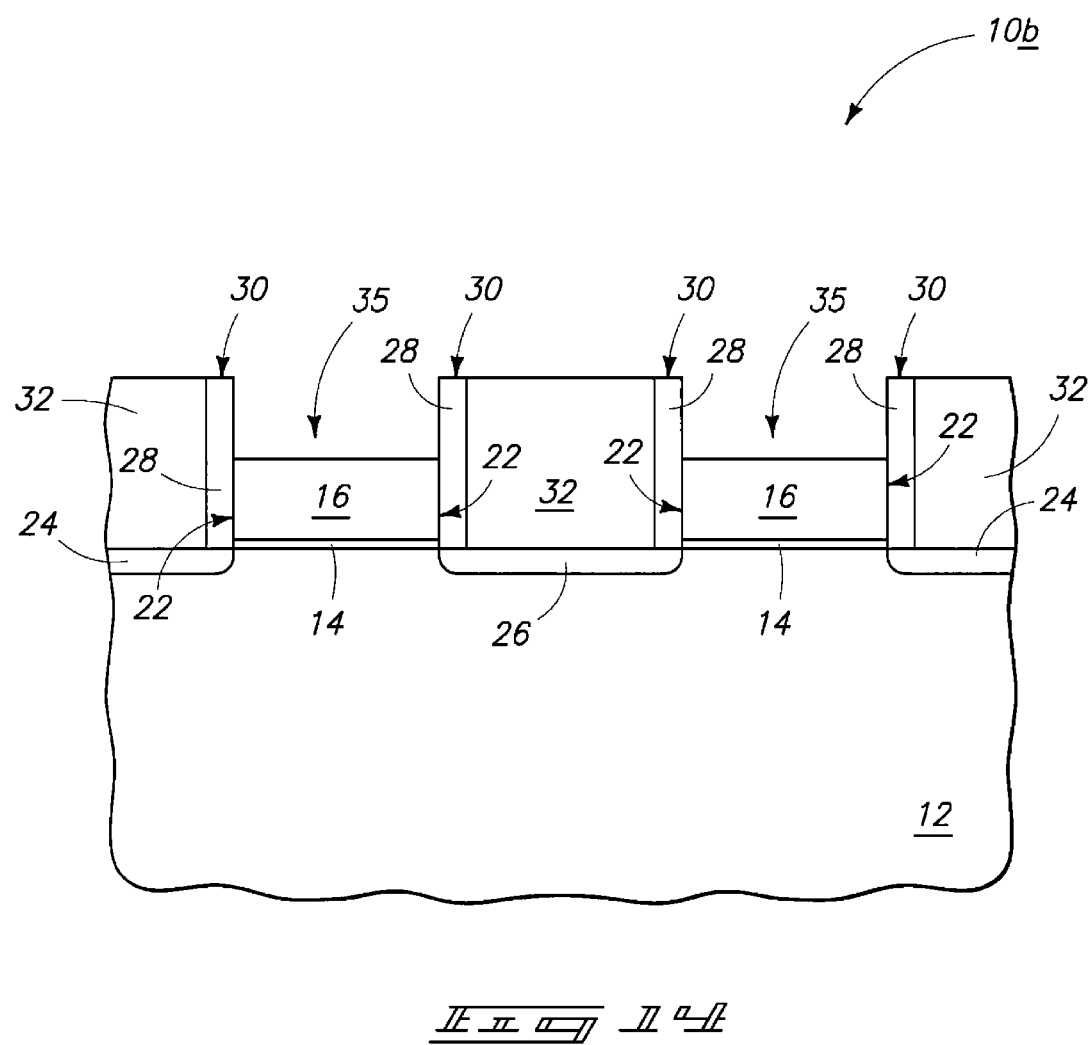
FIG. 14 is a view of the FIG. 13 substrate at a processing step subsequent to that shown by FIG. 13.

FIGS. 13 and 14 depict removal of sacrificial material 18b from being received over conductive gate material 16. FIG. 13 depicts etching of second material 58 (not shown) selectively relative to first material 56. FIG. 14 depicts subsequent etching of first material 56 (not shown) selectively relative to conductive first gate material 16, thereby forming void space 35. Such may be conducted, in one example, wherein conductive gate material 16 consists essentially of conductively doped silicon, and second material 58 consists essentially of silicon whether doped or undoped. Regardless, processing may otherwise or alternately proceed as described above in connection with the FIGS. 1-11 embodiments.

Figure 15:
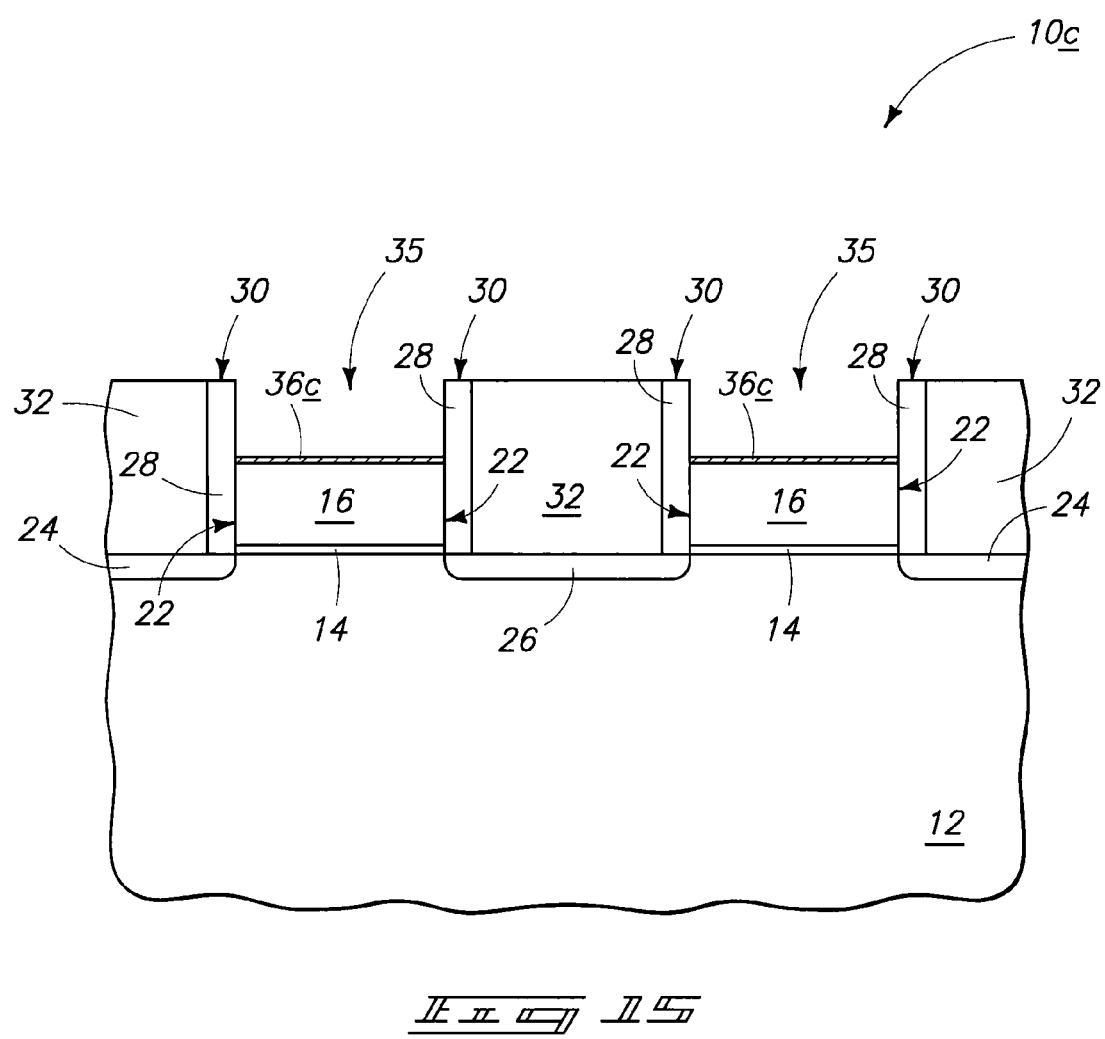
FIG. 15 is a diagrammatic sectional view of a substrate in process in accordance with an embodiment of the invention.

Another embodiment of a method of forming a transistor gate construction is next described with reference to FIGS. 15-17 with respect to a substrate fragment 10c. Like numerals from the above-described embodiments have been utilized where appropriate, with some construction differences being indicated with the suffix "c" or with different numerals. FIG. 15 depicts example processing alternate to that shown and described above with respect to FIG. 8. FIG. 15 depicts selective depositing of a first elemental tungsten layer 36c within void space 35 onto conductive gate material 16. An example thickness range for first elemental tungsten layer 36c is from 30 Angstroms to 150 Angstroms. Such may be selectively deposited, for example, as described above in connection with deposition of elemental tungsten 36 but for a shorter period of time than that to achieve the construction of FIG. 8.

Figure 16:
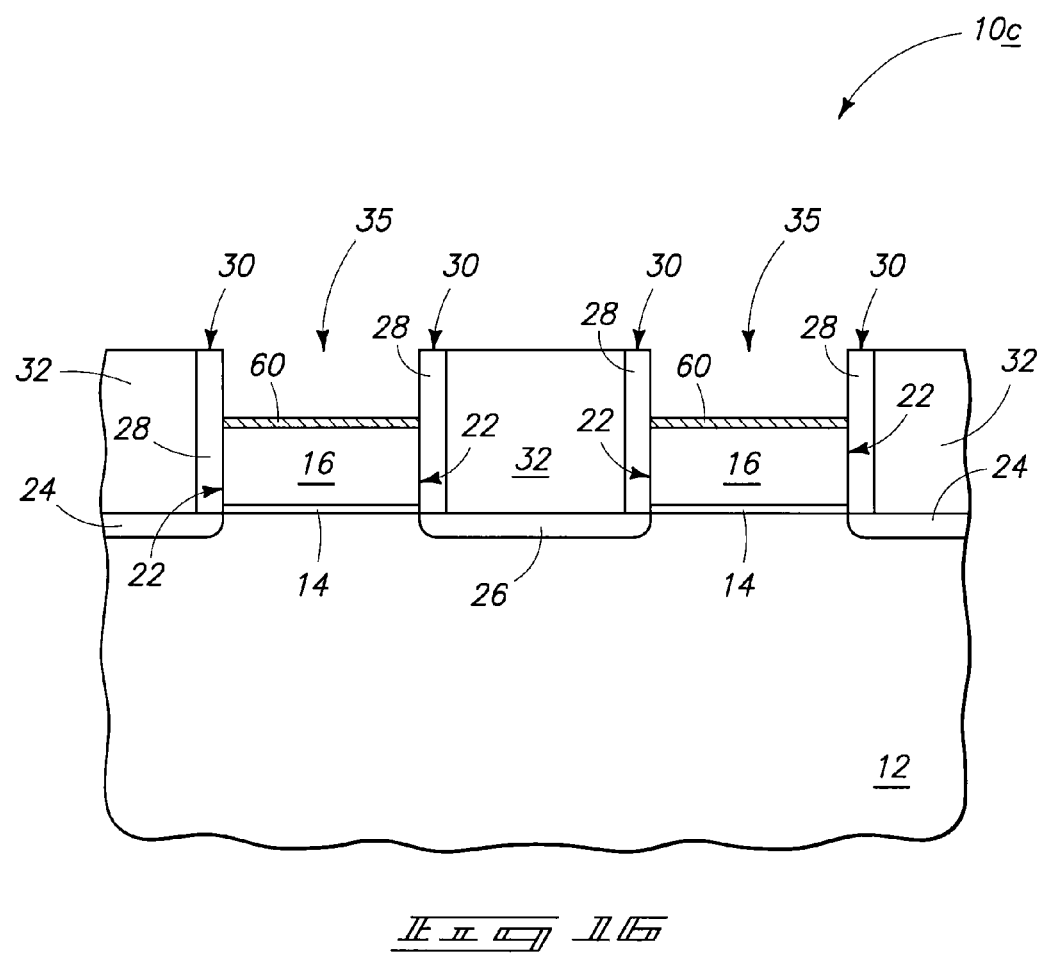
FIG. 16 is a view of the FIG. 15 substrate at a processing step subsequent to that shown by FIG. 15.

Referring to FIG. 16, first elemental tungsten layer 36c (not shown) has been exposed to a nitrogen-containing atmosphere to form $WN_x$ 60 within void space 35. Only some or all of first elemental tungsten layer 36c may be transformed to $WN_x$. Example nitrogen-containing atmospheres comprise one or a combination of $N_2$ or $NH_3$. Plasma may or may not be used, and whether remote or generated within the chamber within which substrate 10c is received. An example substrate temperature range during the exposure to a nitrogen-containing atmosphere is from 300° C. to 900° C., with an example chamber pressure being from 1 mTorr to 10 Torr. Regardless, in one embodiment, x is from 0.1 to 0.5.

Figure 17:
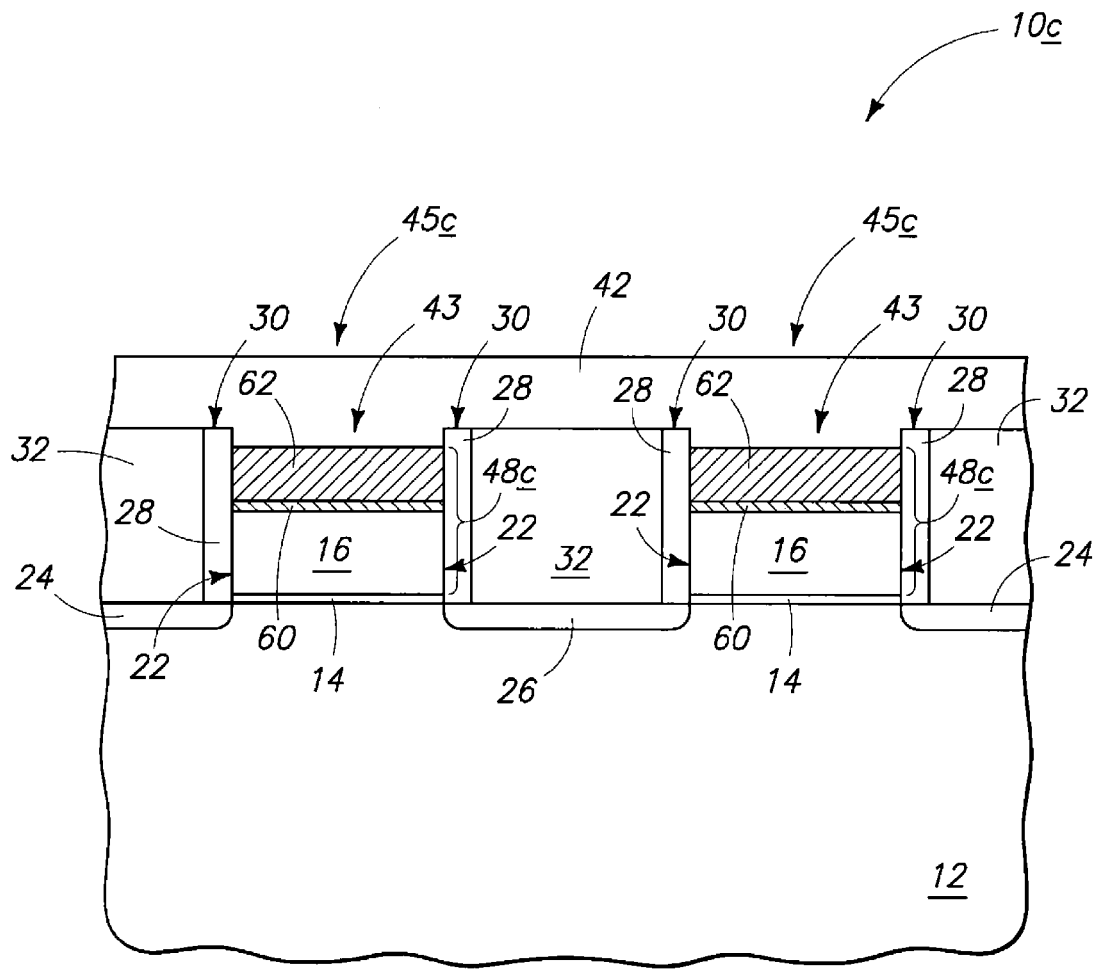
FIG. 17 is a view of the FIG. 16 substrate at a processing step subsequent to that shown by FIG. 16.

Referring to FIG. 17, a second elemental tungsten layer 62 has been selectively deposited within void space 35 onto $WN_x$ 60, for example using any of the above techniques with respect to deposition of layer 36. FIG. 17 also depicts subsequent deposition and planarization back of an insulator material to form an insulator cap 43. Processing may alternately or otherwise occur as described above with respect to any of the above embodiments. Regardless, FIG. 17 depicts an example transistor gate construction 45c comprising a conductive gate electrode 48c comprising conductive gate material 16, $WN_x$ 60, and second elemental tungsten layer 62.

In one embodiment, a method of forming a transistor gate construction may be considered as comprising formation of a gate stack comprising conductively doped silicon, an etch stop layer received outwardly thereof, and silicon which is not conductively doped received over the etch stop layer. For example and by way of examples only, separately consider the embodiments of 10a of FIGS. 11 and 10b of FIG. 12. In fabrication to produce the construction of FIG. 11, a sacrificial material 18 (not shown in FIG. 11) would have initially been provided over second material 52. In such embodiment, first material 53 may comprise conductively doped silicon, second material 52 may comprise an etch stop layer, and sacrificial material 18 (not shown) may comprise silicon which is not conductively doped and which is received over etch stop layer 52. Sacrificial material 18 in such embodiment may be doped do a degree insufficient to impart inherent electrical conductivity.

With respect to embodiment 10b of FIG. 12, conductive gate material 16 may comprise conductively doped silicon, first material 56 may be considered as an etch stop layer, and second material 58 may comprise silicon which is not conductively doped and received over etch stop layer 56. Second material 58 in such embodiment may be doped do a degree insufficient to impart inherent electrical conductivity.

The silicon which is not conductively doped is etched selectively relative to the etch stop layer to form a void space between the insulative material over the conductive gate material. For example with respect to the FIG. 11 embodiment, sacrificial silicon 18 (not shown) would be etched selectively relative to conductive material 52 of conductive gate material 16a to form the void space. In the FIGS. 12-14 embodiment, silicon 58 has been etched selectively relative to etch stop layer 56 in FIG. 13 to form void space 35.

Thereafter in each of the FIG. 11 embodiment and that of FIGS. 12-14, elemental tungsten is selectively deposited within the void space over the conductive gate material. Such is shown in the FIG. 11 embodiment wherein etch stop layer 52 is electrically conductive, elemental tungsten 36 is selectively deposited onto etch stop layer 52, and etch stop layer 52 comprises a part of the finished transistor gate construction. Such includes a conductive gate electrode 48a which comprises elemental tungsten 36, etch stop layer 52, and a conductively doped silicon 53. FIGS. 12-14 depict an alternate example embodiment wherein etch stop layer 56 of FIG. 13 has been etched away from void space 35 in FIG. 14. Thereafter, tungsten would selectively be deposited over the FIG. 14 construction. Such may or may not include the processing described in the FIGS. 15-17 embodiment.

Any of the above example embodiment gate constructions may be used in any circuitry, for example in logic, DRAM or other circuitry. In one embodiment, the method forms DRAM transistor gate constructions. For example, one of the source/drain regions laterally adjacent each of any of the above transistor gate constructions (i.e., each of regions 24) may be connected with a storage device such as a capacitor, with the other source/drain region (i.e., region 26) being connected with a bit line, thereby forming a DRAM unit cell.

The above embodiments also contemplate transistor gate constructions incorporating charge storage structures or other structures beneath/elevationally inward of the above-described example conductive gate electrodes.

One embodiment encompasses a method of forming a NAND transistor gate construction for use in NAND circuitry. Example NAND circuitry is described with reference to FIGS. 18 and 19. FIG. 18 is a simplified block diagram of an example memory system 100. Such includes an integrated circuit NAND flash memory device 102 that includes an array of floating-gate memory cells 104, an address decoder 106, row access circuitry 108, column access circuitry 110, control circuitry 112, input/output (I/O) circuitry 114, and an address buffer 116. Memory system 100 includes an external microprocessor 120 electrically connected to memory device 102 for memory accessing as part of an electronic system. Memory device 102 receives control signals from processor 120 over a control link 122. The memory cells are used to store data that is accessed via a data (DQ) link 124. Address signals are received via an address link 126, and are decoded at address decoder 106 to access the memory array 104. Address buffer circuit 116 latches the address signals. The memory cells may be accessed in response to the control signals and the address signals.

Figure 19:
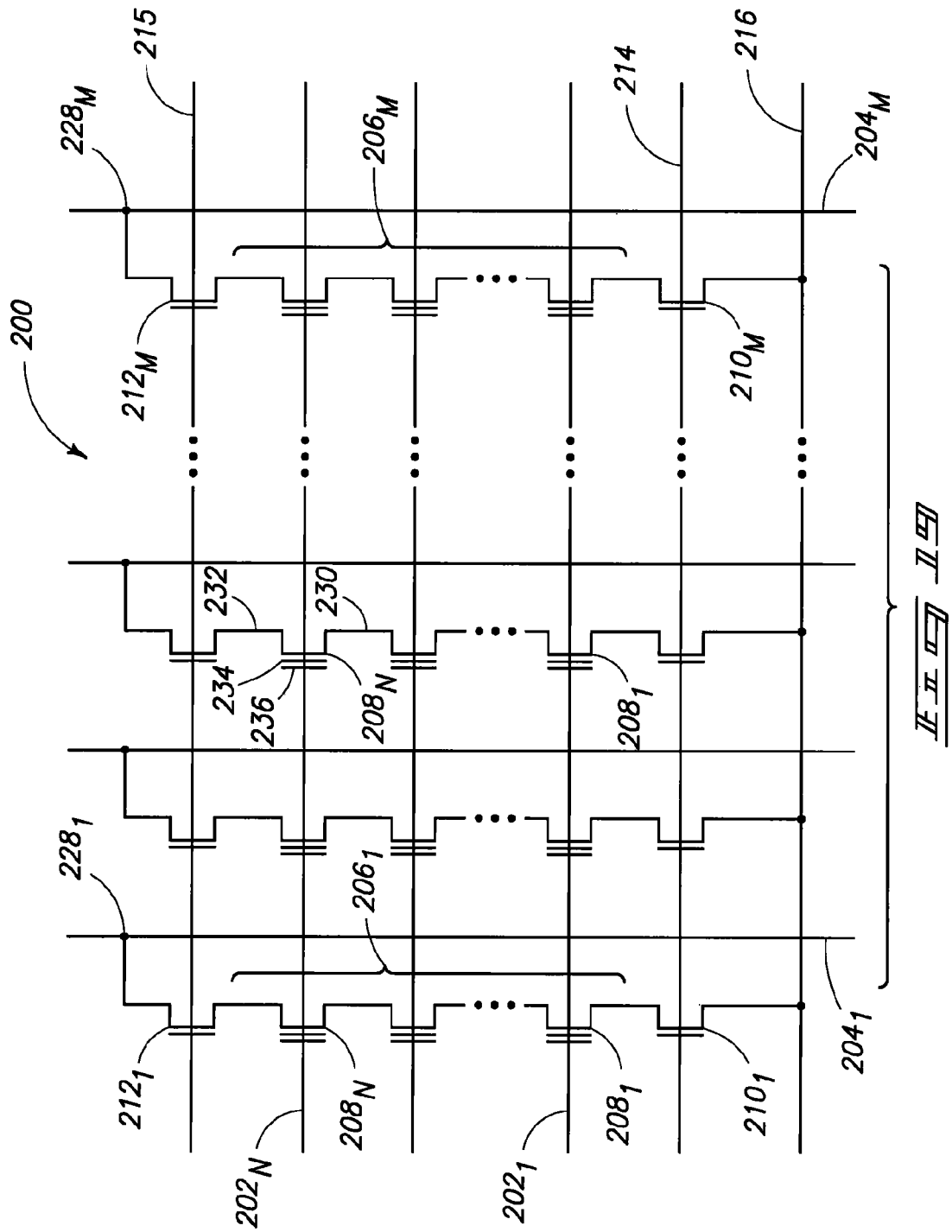
FIG. 19 is a schematic of a NAND memory array in accordance with an embodiment.

FIG. 19 is a schematic of a NAND memory array 200. Such may be a portion of memory array 104 of FIG. 18. Memory array 200 includes access lines (i.e., wordlines) $202_1$ to $202_N$, and intersecting local data lines (i.e., bitlines) $204_1$ to $204_M$. The number of wordlines 202 and the number of bitlines 204 may be each some power of two, for example, 64 wordlines and 64 bitlines. The local bitlines 204 may be coupled to global bitlines (not shown) in a many-to-one relationship.

Memory array 200 includes NAND strings $206_1$ to $206_M$. Each NAND string includes floating gate transistors $208_1$ to $208_N$. The floating gate transistors are located at intersections of wordlines 202 and a local bitlines 204. The floating gate transistors 208 represent non-volatile memory cells for storage of data, or in other words are comprised by flash transistor gates. The floating gate transistors 208 of each NAND string 206 are connected in series source to drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating gate transistor $208_N$ of the corresponding NAND string $206_1$.

Floating gate transistors 208 (i.e., flash transistors 208) include a source 230 and a drain 232, a floating gate 234, and a control gate 236. Floating gate transistors 208 have their control gates 236 coupled to a wordline 202. A column of the floating gate transistors 208 are those NAND strings 206 coupled to a given local bitline 204. A row of the floating gate transistors 208 are those transistors commonly coupled to a given wordline 202.

Figure 20:
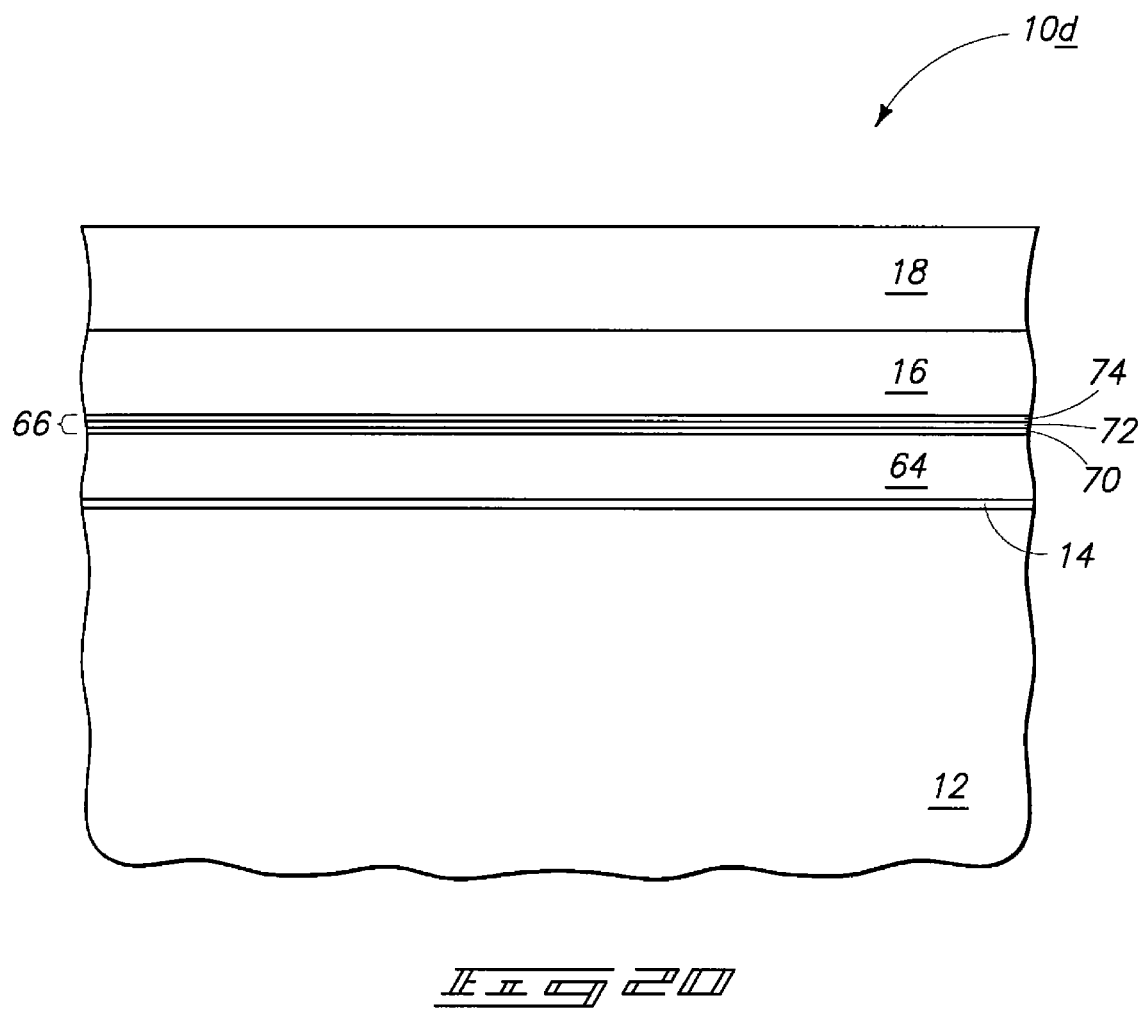
FIG. 20 is a diagrammatic sectional view of a substrate in process in accordance with an embodiment of the invention.

Floating gate transistors 208 may be considered as comprising NAND transistor gate constructions in NAND memory circuitry. Any of the above techniques as shown and described may be used in fabrication of NAND transistor gate constructions wherein any of the above-described conductive gate electrodes are fabricated to comprise control gate electrodes of the NAND transistor gate construction. By way of example only, FIG. 20 depicts one example stack of materials with respect to a substrate fragment 10d from which an example NAND transistor gate construction may be fabricated in accordance with any of the above techniques. Like numerals from the above-described embodiments have been utilized where appropriate, with some construction differences being indicated with the suffix "d" or with different numerals. In FIG. 20, dielectric material 14 which will function as a tunnel dielectric has been formed over semiconductor substrate 12. Floating gate material 64 has been formed over tunnel dielectric material 14. Such may be homogenous or non-homogenous, with suitably doped silicon being one example material.

Gate dielectric material 66 has been formed over floating gate material 64. Such may be homogenous or non-homogenous, with the depicted example showing such being comprised of three layers 70, 72 and 74. Example materials include one or more of silicon dioxide, hafnium oxide, aluminum oxide, zirconium oxide, hafnium aluminum oxide, hafnium silicon oxide, etc. Regardless, conductive control gate material 16 has been formed over gate dielectric material 66. Such may of course be of any of the compositions described above with respect to the conductive gate material. Sacrificial material 18 has been formed over conductive control gate material 16. Such may also of course be of any of the compositions described above with respect to the sacrificial material.

Processing may proceed subsequently as in any of the above-described embodiments which are not duplicated in further drawings for sake of brevity. For example, the sacrificial material, the conductive control gate material, the gate dielectric material, and the floating gate material may be subtractively patterned to form a patterned gate stack. Anisotropically etched insulative sidewall spacers may be formed over lateral sidewalls of the gate stack. The sacrificial material may be etched from being received between the insulative sidewall spacers to form a void space between the insulative sidewall spacers over the conductive control gate material.

Elemental tungsten may be selectively deposited within the void space over the conductive control gate material to span completely between the insulative sidewall spacers but leave an outermost portion of the void space between the insulative spacers outwardly open. The elemental tungsten and the conductive control gate material may comprise a conductive control gate electrode of the NAND transistor gate construction. An insulator may be deposited to fill the outwardly opening portion of the void space.

Any additional or alternate processing may be used as described above in a method of forming a NAND transistor gate construction, with the above description with respect to the stack of FIG. 20 and the example processing described immediately above being but one example.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a transistor gate construction, comprising:
    forming a gate stack comprising a sacrificial material over conductive gate material, the gate stack comprising lateral sidewalls having insulative material there-against;
    removing the sacrificial material from being over the conductive gate material to form a void space between the insulative material over the conductive gate material; and
    selectively depositing elemental tungsten within the void space over the conductive gate material and forming there-from a transistor gate construction having a conductive gate electrode comprising the conductive gate material and the elemental tungsten, the deposited elemental tungsten comprising crystalline grain size equal to width of the void space.

2. The method of claim 1 wherein the conductive gate material comprises an outermost portion comprising $WSi_x$, the elemental tungsten being selectively deposited onto the $WSi_x$.

3. The method of claim 1 wherein the sacrificial material is of different composition from that of the insulative material.

4. The method of claim 1 wherein the sacrificial material comprises insulator material.

5. The method of claim 1 wherein the sacrificial material comprises semiconductive material.

6. The method of claim 1 wherein the sacrificial material comprises conductive material.

7. The method of claim 1 wherein the sacrificial material comprises insulator material and semiconductive material.

8. The method of claim 1 wherein the sacrificial material comprises silicon.

9. The method of claim 1 wherein the sacrificial material comprises different composition first and second materials, the second material being over the first material, said removing comprising etching the second material selectively relative to the first material followed by etching the first material selectively relative to the conductive first gate material.

10. The method of claim 9 wherein the second material and the conductive gate material comprise silicon.

11. The method of claim 10 wherein the first material comprises silicon dioxide.

12. The method of claim 1 wherein the selectively depositing of elemental tungsten within the void space over the conductive gate material does not fill the void space and leaves an outermost portion of the void space between the insulative material outwardly open.

13. The method of claim 12 comprising depositing an insulator to fill the outwardly open portion of the void space.

14. The method of claim 13 comprising:
    depositing the insulator to overfill the outwardly open portion of the void space; and
    after overfilling the outwardly open portion of the void space with the insulator, planarizing the insulator.

15. The method of claim 1 wherein the selectively deposited elemental tungsten is never etched after its deposition in the forming of the transistor gate construction.

16. A method of forming a transistor gate construction, comprising:
    forming a gate stack comprising a sacrificial material over conductive gate material, the gate stack comprising lateral sidewalls having insulative material there-against;
    removing the sacrificial material from being over the conductive gate material to form a void space between the insulative material over the conductive gate material;
    selectively depositing a first elemental tungsten layer within the void space onto the conductive gate material;
    exposing the first elemental tungsten layer to a nitrogen-containing atmosphere to form $WN_x$ within the void space; and
    selectively depositing a second elemental tungsten layer within the void space onto the $WN_x$ and forming therefrom a transistor gate construction having a conductive gate electrode comprising the conductive gate material, the $WN_x$ and the second elemental tungsten layer.

17. The method of claim 16 wherein x is from 0.1 to 0.5.

18. The method of claim 16 wherein the first elemental tungsten layer is deposited to a thickness from about 30 Angstroms to 150 Angstroms.

19. The method of claim 16 wherein the nitrogen-containing atmosphere comprises $N_2$.

20. The method of claim 16 wherein the nitrogen-containing atmosphere comprises $NH_3$.

21. The method of claim 16 wherein the nitrogen-containing atmosphere comprises a plasma derived from at least one of $N_2$ and $NH_3$.

22. The method of claim 16 wherein the selectively depositing of the second elemental tungsten layer within the void space onto the $WN_x$ does not fill the void space and leaves an outermost portion of the void space between the insulative material outwardly open.

23. The method of claim 16 wherein the second elemental tungsten layer is formed to a greater thickness than the $WN_x$ in the finished gate construction.

24. The method of claim 23 wherein the selectively depositing of elemental tungsten within the void space over the conductive gate material does not fill the void space and leaves an outermost portion of the void space between the insulative material outwardly open, and further comprising:
filling the outermost portion of the void space with insulating material of the same composition as the insulator material and the insulative material.

25. The method of claim 16 wherein the second elemental tungsten comprises crystalline grain size equal to width of the void space.

26. A method of forming a NAND transistor gate construction, comprising:
forming tunnel dielectric material over a semiconductor substrate;
forming floating gate material over the tunnel dielectric material;
forming gate dielectric material over the floating gate material;
forming conductive control gate material over the gate dielectric material;
forming sacrificial material over the conductive control gate material;
subtractively patterning the sacrificial material, the conductive control gate material, the gate dielectric material, and the floating gate material to form a patterned gate stack;
forming anisotropically etched insulative sidewall spacers over lateral sidewalls of the gate stack;
etching the sacrificial material from being between the insulative sidewall spacers to form a void space between the insulative sidewall spacers over the conductive control gate material;
selectively depositing elemental tungsten within the void space over the conductive control gate material to span completely between the insulative sidewall spacers but leave an outermost portion of the void space between the insulative spacers outwardly open, the elemental tungsten and the conductive control gate material comprising a conductive control gate electrode of the NAND transistor gate construction, the deposited elemental tungsten comprising crystalline grain size equal to width of the void space; and
forming an insulator to fill the outwardly opening portion of the void space.

27. The method of claim 26 comprising:
forming the insulator to overfill the outwardly open portion of the void space; and
after overfilling the outwardly open portion of the void space with the insulator, planarizing the insulator.

28. A method of forming a DRAM transistor gate construction, comprising:
forming gate dielectric material over a semiconductor substrate;
forming conductive gate material over the gate dielectric material;
forming sacrificial material over the conductive gate material;
subtractively patterning the sacrificial material and the conductive gate material to form a patterned gate stack;
forming anisotropically etched insulative sidewall spacers over lateral sidewalls of the gate stack;
etching the sacrificial material from being between the insulative sidewall spacers to form a void space between the insulative sidewall spacers over the conductive gate material;
selectively depositing elemental tungsten within the void space over the conductive gate material to span completely between the insulative sidewall spacers but leave an outermost portion of the void space between the insulative spacers outwardly open, the elemental tungsten and the conductive gate material comprising a conductive gate electrode of the DRAM transistor gate construction, the deposited elemental tungsten comprising crystalline grain size equal to width of the void space; and
forming an insulator to fill the outwardly opening portion of the void space.

29. The method of claim 28 comprising:
forming the insulator to overfill the outwardly open portion of the void space; and
after overfilling the outwardly open portion of the void space with the insulator, planarizing the insulator.

30. A method of forming a transistor gate construction, comprising:
forming a gate stack comprising conductively doped silicon, an etch stop layer outwardly of the conductively doped silicon, and silicon which is not conductively doped over the etch stop layer, the gate stack comprising lateral sidewalls having insulative material thereagainst;
etching the silicon which is not conductively doped selectively relative to the etch stop layer to form a void space between the insulative material over the conductive gate material; and
selectively depositing elemental tungsten within the void space over the conductive gate material and forming there-from a transistor gate construction having a conductive gate electrode comprising the conductive gate material and the elemental tungsten;
wherein the elemental tungsten comprises crystalline grain size equal to width of the void space.

* * * * *